US008748299B2

(12) United States Patent
Shin

(10) Patent No.: US 8,748,299 B2
(45) Date of Patent: Jun. 10, 2014

(54) SEMICONDUCTOR DEVICES HAVING AN EPITAXIAL LAYER ON ACTIVE REGIONS AND SHALLOW TRENCH ISOLATION REGIONS

(75) Inventor: Dong-Suk Shin, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 289 days.

(21) Appl. No.: 12/656,752

(22) Filed: Feb. 16, 2010

(65) Prior Publication Data

US 2010/0207210 A1 Aug. 19, 2010

(30) Foreign Application Priority Data

Feb. 16, 2009 (KR) .................. 10-2009-0012206

(51) Int. Cl.
*H01L 21/36* (2006.01)
*H01L 21/20* (2006.01)
(52) U.S. Cl.
USPC ............................ 438/481; 438/226; 438/222
(58) Field of Classification Search
USPC .......................................... 438/222, 226, 481
See application file for complete search history.

(56) References Cited

U.S. PATENT DOCUMENTS

| 6,977,419 | B2 | 12/2005 | Wang |
| 7,306,997 | B2* | 12/2007 | Xiang et al. ............... 438/300 |
| 2005/0035408 | A1* | 2/2005 | Wang et al. ............... 257/344 |
| 2005/0093028 | A1* | 5/2005 | Chambers ................. 257/250 |
| 2005/0106838 | A1* | 5/2005 | Lim et al. ................. 438/442 |
| 2005/0116279 | A1* | 6/2005 | Koh ........................... 257/314 |
| 2005/0145944 | A1* | 7/2005 | Murthy et al. ............. 257/351 |
| 2005/0272193 | A1* | 12/2005 | Kim et al. ................. 438/197 |
| 2005/0281125 | A1* | 12/2005 | Chung ....................... 365/232 |
| 2006/0040464 | A1* | 2/2006 | Jung ........................... 438/424 |
| 2006/0073662 | A1* | 4/2006 | Jang et al. ................. 438/299 |
| 2006/0189043 | A1* | 8/2006 | Schulz ....................... 438/142 |
| 2007/0190731 | A1 | 8/2007 | Chen |
| 2008/0237655 | A1* | 10/2008 | Nakabayashi et al. ..... 257/255 |

FOREIGN PATENT DOCUMENTS

KR 102007000265 1/2007

* cited by examiner

*Primary Examiner* — Fernando L Toledo
*Assistant Examiner* — Peter Bradford
(74) *Attorney, Agent, or Firm* — Harness, Dickey & Pierce, P.L.C.

(57) ABSTRACT

A semiconductor device includes an isolation layer pattern, an epitaxial layer pattern, a gate insulation layer pattern and a gate electrode. The isolation layer pattern is formed on a substrate, and defines an active region in the substrate. The isolation layer pattern extends in a second direction. The epitaxial layer pattern is formed on the active region and the isolation layer pattern, and has a width larger than that of the active region in a first direction perpendicular to the second direction. The gate insulation layer pattern is formed on the epitaxial layer pattern. The gate electrode is formed on the gate insulation layer pattern.

17 Claims, 10 Drawing Sheets

1ST DIRECTION  2ND DIRECTION

2ND DIRECTION ⊗ ⟶ 1ST DIRECTION

1ST DIRECTION ⊗ ⟶ 2ND DIRECTION

1ST DIRECTION ⊗ ⟶ 2ND DIRECTION

SEMICONDUCTOR DEVICES HAVING AN EPITAXIAL LAYER ON ACTIVE REGIONS AND SHALLOW TRENCH ISOLATION REGIONS

CROSS-REFERENCE TO RELATED APPLICATIONS

This application claims priority under 35 USC §119 to Korean Patent Application No. 10-2009-0012206, filed on Feb. 16, 2009, in the Korean Intellectual Property Office (KIPO), the entire contents of which is incorporated herein by reference.

BACKGROUND

1. Field

Example embodiments of the inventive concepts relate to semiconductor devices and methods of manufacturing the same. More particularly, example embodiments relate to semiconductor devices having shallow trench isolation (STI) structures and methods of manufacturing the same.

2. Description of the Related Art

Isolation layers may be formed in semiconductor devices by a shallow trench isolation (STI) process. When a STI process is performed, a pad oxide layer and a pad nitride layer pattern may be formed on a silicon substrate. A trench may be formed in an upper portion of the substrate by etching the substrate using the pad nitride layer pattern as an etch mask. An oxide layer may be formed to fill the trench on the substrate. An upper portion of the oxide layer may be planarized by a chemical mechanical polishing (CMP) process and/or an etch back process, thereby forming an isolation layer having a STI structure in the trench.

Prior to forming an oxide layer in the trench, an inner wall of the trench may be thermally treated to form an inner wall oxide layer that may cure damage to the substrate generated during the etch process. The isolation layer may expand in subsequent heat treatments (e.g., during forming of a gate oxide layer) thereby generating dislocation of silicon in the substrate.

The pad nitride layer pattern may be removed by a wet etch process. During the wet etch, upper edge portions of the isolation layer and the substrate may be removed to form a dent (e.g., a recess). A gate oxide layer subsequently formed on the substrate may be relatively thin at the upper edge portion of the substrate. Thus, the electric field may be concentrated at the upper edge portion to generate an inverse narrow width effect in which a threshold voltage of a transistor may increase as a channel width decreases. Additionally, a hump effect may occur in which a threshold voltage decreases at a portion of a channel of a transistor because silicon at the upper edge portion of the substrate may not have a uniform crystalline structure.

In order to solve the above problems, a nitride liner may be formed on the inner wall oxide layer. The nitride liner may absorb stress on the substrate because of the expansion of the isolation layer in a subsequent oxidation process and may reduce and/or prevent penetration of oxygen into the inner wall oxide layer, thereby reducing and/or preventing the dislocation of silicon in the substrate. The double liner structure having both of the inner wall oxide layer and the nitride liner may reduce a change of a threshold voltage. However, the double liner may deteriorate gap filling characteristics and the process for forming the above STI structure may be complicated.

SUMMARY

Example embodiments of the inventive concepts may provide semiconductor devices having improved electrical characteristics and methods of manufacturing semiconductor device having improved electrical characteristics.

According to example embodiments of the inventive concepts, a semiconductor device may be provided. The semiconductor device includes an isolation layer pattern, an epitaxial layer pattern, a gate insulation layer pattern and a gate electrode. The isolation layer pattern is formed on a substrate and defines an active region in the substrate. The isolation layer pattern extends in a second direction. The epitaxial layer pattern is formed on the active region and the isolation layer pattern, and has a width larger than that of the active region in a first direction perpendicular to the second direction. The gate insulation layer pattern is formed on the epitaxial layer pattern. The gate electrode is formed on the gate insulation layer pattern.

According to example embodiments of the inventive concepts, a semiconductor device may be provided. The semiconductor device includes a substrate, an isolation layer on the substrate, the isolation layer extending in a first direction, an active region in the substrate, the isolation layer defining the active region, an epitaxial layer on the active region and the isolation layer, the epitaxial layer wider than the active region in a second direction perpendicular to the first direction, a gate insulation layer on the epitaxial layer and a gate electrode on the gate insulation layer.

The isolation layer pattern may be in a trench at an upper portion of the substrate and include a gap filling layer pattern and a liner. The gap filling layer pattern may fill the trench and the liner may be formed between the gap filling layer pattern and the substrate. The epitaxial layer pattern may include a single crystalline material. The semiconductor device may include a first spacer on a sidewall of the gate electrode. The semiconductor device may include a second spacer on sidewalls of the first spacer, the gate insulation layer pattern and the epitaxial layer pattern.

The first spacer may be formed on the gate insulation layer pattern. The semiconductor device may include a source/drain region at an upper portion of the active region of the substrate adjacent to the epitaxial layer pattern. The source/drain region may have a top surface of which a level is lower than that of a top surface of the epitaxial layer pattern. The semiconductor device may include a first metal silicide layer on the gate electrode and a second metal silicide layer at an upper portion of the active region adjacent to the epitaxial layer pattern.

According to example embodiments of the inventive concepts, there may be provided a method of manufacturing a semiconductor device. According to the method, an isolation layer pattern is formed on a substrate to define an active region in the substrate. The isolation layer pattern fills a trench at an upper portion of the substrate and extending in a second direction. An epitaxial layer is formed on the active region and the isolation layer pattern by a selective epitaxial growth (SEG) process. The epitaxial layer has a width larger than that of the active region in a first direction perpendicular to the second direction. A gate insulation layer is formed on the epitaxial layer. A gate electrode is formed on the gate insulation layer. The gate insulation layer and the epitaxial layer are partially removed using the gate electrode as an etch mask to form a gate insulation layer pattern and an epitaxial layer pattern, respectively.

According to example embodiments of the inventive concepts, there may be provided a method of manufacturing a semiconductor device. The method includes forming an isolation layer in a trench of a substrate, the isolation layer defining an active region in the substrate, the isolation layer formed to extend in a first direction, forming an epitaxial layer on the active region and the isolation layer by selective epitaxial growth (SEG), forming a gate insulation layer on the epitaxial layer, forming a gate electrode on the gate insulation layer and partially removing the gate insulation layer and the epitaxial layer using the gate electrode as an etch mask such that the epitaxial layer is wider than the active region in a second direction perpendicular to the first direction.

Prior to forming the gate insulation layer pattern and the epitaxial layer pattern, a first spacer may be further formed on a sidewall of the gate electrode. After forming the first spacer on the sidewall of the gate electrode, a second spacer may be further formed on a sidewall of the first spacer, the gate insulation layer pattern and the epitaxial layer pattern. A source/drain region may be formed at an upper portion of the active region of the substrate by implanting impurities onto the substrate using the gate electrode, the gate insulation layer pattern and the epitaxial layer pattern as an ion implantation mask.

According to example embodiments of the inventive concepts, a semiconductor device may be provided. The semiconductor device includes a substrate, a plurality of shallow trench isolation (STI) regions in the substrate, an active region in the substrate between the plurality of STI regions and an epitaxial layer on the plurality of STI regions and the active region.

According to example embodiments of the inventive concepts, a semiconductor device may include the epitaxial layer pattern serving as a channel, wherein the epitaxial layer pattern has a single crystalline material and a width larger than that of the active region of the substrate. The semiconductor device may have improved threshold voltage characteristics and improved reliability.

BRIEF DESCRIPTION OF THE DRAWINGS

Example embodiments will be more clearly understood from the following brief description taken in conjunction with the accompanying drawings.

FIG. 1 is a perspective view illustrating a semiconductor device according to example embodiments of the inventive concepts;

FIGS. 2-10 are cross-sectional views illustrating methods of manufacturing the semiconductor device of FIG. 1 according to example embodiments of the inventive concepts;

FIG. 11 is a perspective view illustrating a semiconductor device according to example embodiments of the inventive concepts;

FIGS. 12-14 are cross-sectional views illustrating methods of manufacturing the semiconductor device of FIG. 11 according to example embodiments of the inventive concepts;

FIG. 15 is a schematic diagram roughly illustrating a memory card 500 according to example embodiments; and FIG. 16 is a block diagram roughly illustrating an electronic system 600 according to example embodiments.

Figure 1:
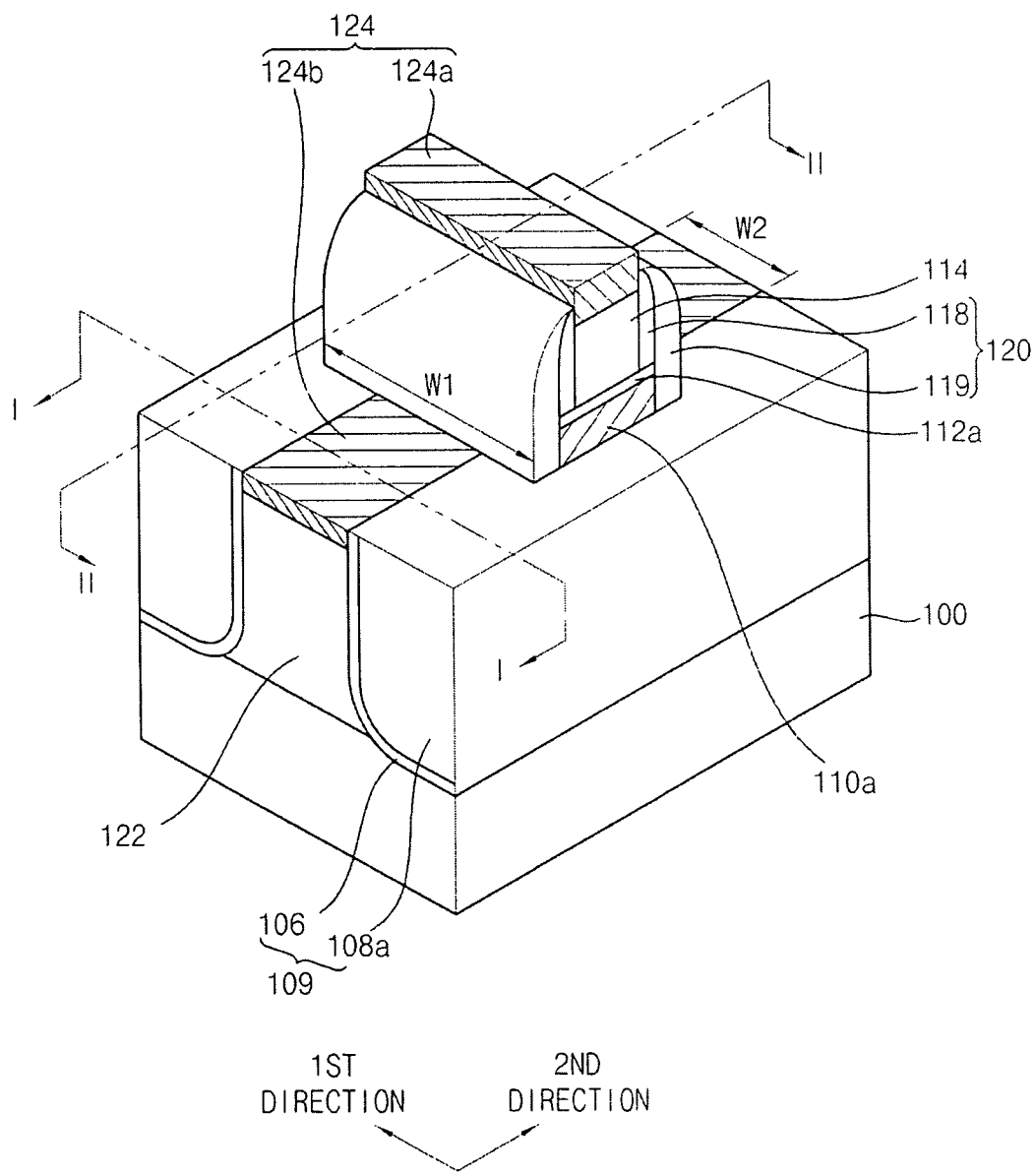
FIGS. 1-16 represent non-limiting, example embodiments as described herein.

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the example embodiments set forth herein. Rather, these example embodiments are provided so that this description will be thorough and complete, and will fully convey the scope of the inventive concepts to those of ordinary skill in the art. In the drawings, the sizes and relative sizes of elements (e.g., layers and regions) may be exaggerated for clarity. Like reference numerals in the drawings denote like elements, and thus their description will be omitted.

It will be understood that when an element is referred to as being "on," "connected to" or "coupled to" another element, it can be directly on, connected or coupled to the other element or intervening elements may be present. In contrast, when an element is referred to as being "directly on," "directly connected to" or "directly coupled to" another element, there are no intervening elements present. Like numbers refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent").

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concept.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a semiconductor device according to example embodiments of the inventive concepts. Referring to FIG. 1, a semiconductor device may include an epitaxial layer pattern 110a, a gate insulation layer pattern 112a, a gate electrode 114, metal silicide layers 124, a gate spacer 120 and a source/drain region 122. The epitaxial layer pattern 110a may be on a substrate 100 and an isolation layer pattern 109. The substrate 100 may include a semiconductor substrate (e.g., a silicon substrate, a germanium substrate and/or a silicon-germanium substrate). According to example embodiments of the inventive concepts, the substrate 100 may include a single crystalline silicon substrate. The isolation layer pattern 109 may be on the substrate 100 and may define an active region in the substrate 100. The isolation layer pattern 109 may extend in a second direction 2ND DIRECTION.

The active region of the substrate 100 may extend in the second direction 2ND DIRECTION. The active region may have a width W2 in a first direction 1ST DIRECTION perpendicular to the second direction 2ND DIRECTION. The isolation layer pattern 109 may include a gap filling layer pattern 108a and a liner 106. The gap filling layer pattern 108a may include an oxide. For example, the gap filling layer pattern 108a may include undoped silicate glass (USG), borophosphosilicate glass (BPSG), phosphosilicate glass (PSG), flowable oxide (FOX), plasma-enhanced tetraethylorthosilicate (PE-TEOS), tonen silazene (TOSZ), fluorosilicate glass (FSG), and/or high density plasma (HDP) oxide. The liner 106 may include, for example, a nitride and/or an oxide. The liner 106 may be between the substrate 100 and the gap filling layer pattern 108a.

The epitaxial layer pattern 110a may include a single crystalline material (e.g., single crystalline silicon). The epitaxial layer pattern 110a may include one or more impurities (e.g., carbon and/or boron) According to example embodiments of the inventive concepts, the epitaxial layer pattern 110a may have a width W1 in the first direction 1ST DIRECTION. The epitaxial layer pattern 110a may serve as a channel of the semiconductor device. The gate insulation layer pattern 112a may be on the epitaxial layer pattern 110a. The gate insulation layer pattern 112a may be on the epitaxial layer pattern 110a and on the isolation layer pattern 109. The gate insulation layer pattern 112a may extend in the first direction 1ST DIRECTION. The gate insulation layer pattern 112a may include a dielectric (e.g., silicon oxide, silicon oxynitride and/or a high-k oxide).

The gate electrode 114 may be on the gate insulation layer pattern 112a. The gate electrode 114 may include, for example, doped polysilicon. The gate electrode 114 may have a multi-layered structure including, for example, doped polysilicon, a metal and/or a metal silicide. The metal silicide layers 124 may include a first metal silicide layer 124a and a second metal silicide layer 124b. The first metal silicide layer 124a may be on the gate electrode 114 and the second metal silicide layer 124b may be at an upper portion of the substrate 100 adjacent to the gate spacer 120. The second metal silicide layer 124b may have a top surface at a level that is lower than a top surface of the epitaxial layer pattern 110a. According to example embodiments of the inventive concepts, the metal silicide layers 124 may include a metal silicide (e.g., cobalt silicide).

The gate spacer 120 may include a first spacer 118 and a second spacer 119. The first spacer 118 may be on sidewalls of, for example, the gate electrode 114 and the first metal silicide layer 124a. The second spacer 119 may be, for example, on sidewalls of the first spacer 118, the gate insulation layer pattern 112a and the epitaxial layer pattern 110a. The source/drain region 122 may be at an upper portion of the substrate 100 beneath the second metal silicide layer 124b adjacent to the epitaxial layer pattern 110a. The source/drain region 122 may have a top surface at a level that is lower than a top surface of the epitaxial layer pattern 110a.

A semiconductor device may include the epitaxial layer pattern 110a having the width W1 greater than the width W2 of the active region. The inverse narrow width effect may be prevented.

Figure 2:
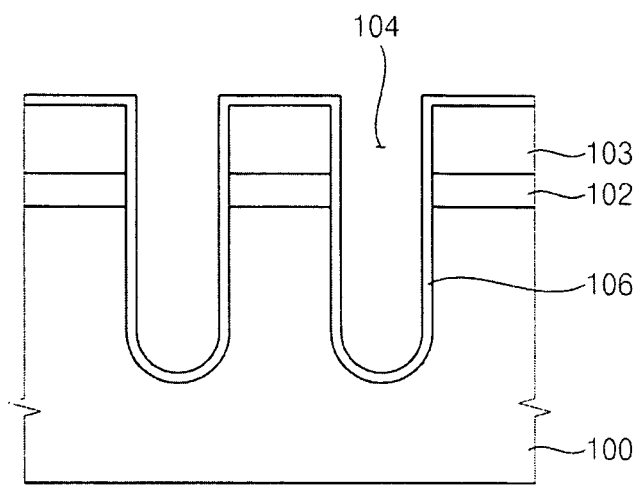

FIGS. 2-10 are cross-sectional views illustrating methods of manufacturing the semiconductor device of FIG. 1 according to example embodiments of the inventive concepts. FIGS. 2-6 are cross-sectional views taken along the line I-I' and FIGS. 7-10 are cross-sectional views taken along the line II-II'. Referring to FIG. 2, a substrate 100 (e.g., a silicon substrate, a germanium substrate and/or a silicon-germanium substrate) may be provided. According to example embodiments of the inventive concepts, a single crystalline silicon substrate may be provided. A pad oxide layer (not shown) and a pad nitride layer 102 may be formed on the substrate 100. A hard mask 103 extending in a second direction 2ND DIRECTION may be formed on the pad nitride layer 102.

The pad nitride layer 102, the pad oxide layer (not shown) and an upper portion of the substrate 100 may be partially etched using the hard mask 103 as an etch mask, forming a trench 104 extending in the second direction 2ND DIRECTION. According to example embodiments of the inventive concepts, a plurality of trenches 104 may be formed in a first direction 1ST DIRECTION perpendicular to the second direction 2ND DIRECTION. A liner 106 may be formed on a bottom and sidewalls of the trench 104 and the hard mask 103, so that damage to the substrate 100 that may be generated during the etch process may be cured. The liner 106 may be formed using, for example, a nitride and/or an oxide. In an example embodiment, the liner 106 may be formed by a heat treatment process on the etched portion of the substrate 100.

Figure 3:
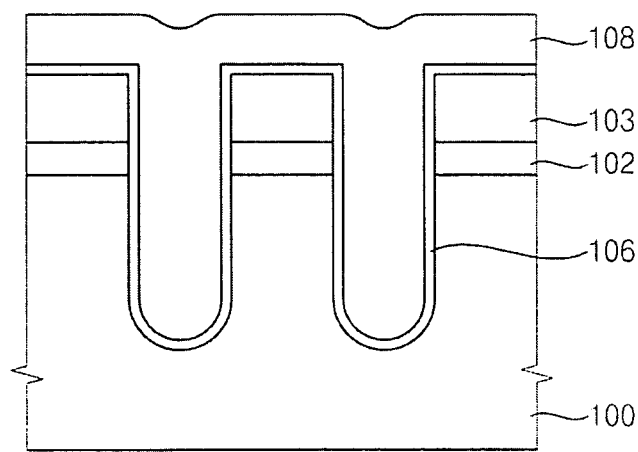
Figure 4:
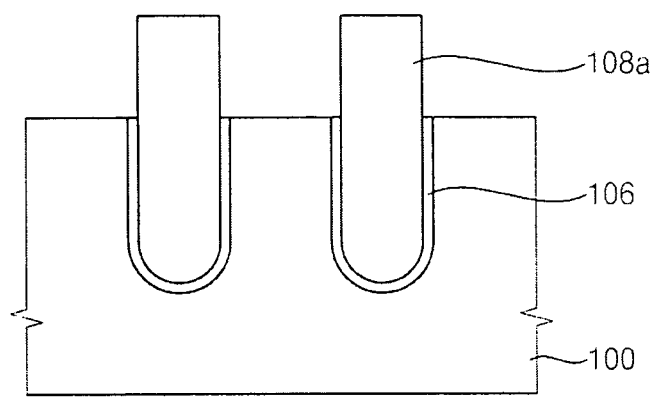

Referring to FIG. 3, a gap filling layer 108 may be formed on the liner 106 to fill the trench 104. The gap filling layer 108 may be formed using an oxide (e.g., USG, BPSG, PSG, FOX, PE-TEOS, TOSZ, FSG, and/or HDP oxide) by a chemical vapor deposition (CVD) process. In the CVD process, for example, silane gas, oxygen gas and/or argon gas may be used. Referring to FIG. 4, an upper portion of the gap filling layer 108 may be planarized by a chemical mechanical polishing (CMP) process and/or an etch back process until a top surface of the hard mask 103 is exposed. The hard mask 103, the pad nitride layer 102 and a portion of the liner 106 thereon may be removed by a wet etch process, forming a gap filling layer pattern 108a protruding from the substrate 100. The wet etch process may be performed using a solution including, for example, phosphoric acid.

Figure 5:
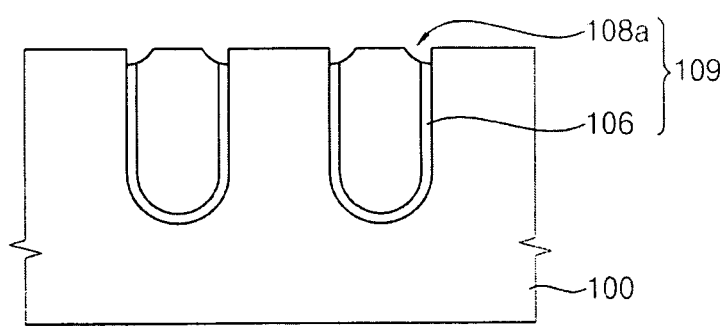

Referring to FIG. 5, an upper portion of the gap filling layer pattern 108a may be removed by an etch process so that a top surface of the gap filling layer pattern 108a may have a level substantially the same as that of a top surface of the substrate 100. In the etch process, a dent may be formed at top surfaces of the gap filling layer pattern 108a the liner 106. The gap filling layer pattern 108a and the liner 106 may define an isolation layer pattern 109.

Figure 6:
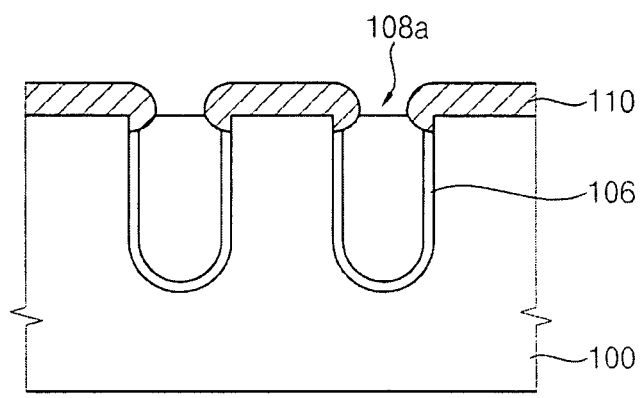

Referring to FIG. 6, a selective epitaxial growth (SEG) process may be performed on the substrate 100 to form an epitaxial layer 110. The epitaxial layer 110 may be formed on the top surface of the substrate 100, and on top surfaces of the liner 106 and the gap filling layer pattern 108a at which the dent is formed. According to example embodiments of the inventive concepts, the epitaxial layer 110 may be formed to have a thickness of, for example, about 10 nm to about 50 nm in a vertical direction from the top surface of the substrate 100 and a thickness of, for example, about 10 nm to about 30 nm in a horizontal direction from an exposed side surface of the substrate 100. The SEG process may be performed at a temperature of, for example, about 700 to about 900° C. A source gas may be provided onto the substrate 100 so that the epitaxial layer 110 may be grown on the top surface of the substrate 100 using the substrate 100 as a seed layer. A seed layer (not shown) may be formed on the substrate 100 before providing the source gas onto the substrate 100.

According to example embodiments of the inventive concepts, the epitaxial layer 110 may be formed using, for example, silane gas, disilane gas and/or germane gas as a source gas. One or more impurities (e.g., carbon and/or boron) may be doped into the epitaxial layer 110. $SiCH_4$ gas and/or $B_2H_6$ gas may be used as an impurity source gas. An amorphous thin layer (not shown) may be formed on a top surface of the isolation layer pattern 109 on which the epitaxial layer 110 is not formed during the SEG process. The amorphous thin layer may be removed.

Figure 7:
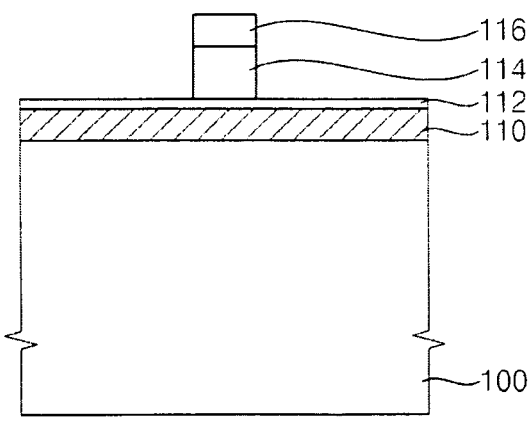

Referring to FIG. 7, a gate insulation layer 112 may be formed on the epitaxial layer 110 and the isolation layer pattern 109. The gate insulation layer 112 may be formed using, for example, silicon oxide, silicon oxynitride and/or a high-k oxide. According to example embodiments of the inventive concepts, the gate insulation layer 112 may be formed by, for example, a thermal oxidization process. The gate insulation layer 112 may be selectively formed on the epitaxial layer 110. A conductive layer (not shown) may be formed on the gate insulation layer 112. The conductive layer may be formed using, for example, doped polysilicon. The conductive layer may be formed, for example, to have a multi-layered structure including doped polysilicon, a metal and/or a metal silicide.

A gate mask layer (not shown) may be formed on the conductive layer. The gate mask layer may be formed using, for example, silicon nitride. The gate mask layer may be patterned using a photoresist pattern (not shown) to form a gate mask 116 extending in the first direction 1ST DIRECTION. The photoresist pattern may be removed. The conductive layer may be patterned using the gate mask 116 as an etch mask to form a gate electrode 114.

Figure 8:
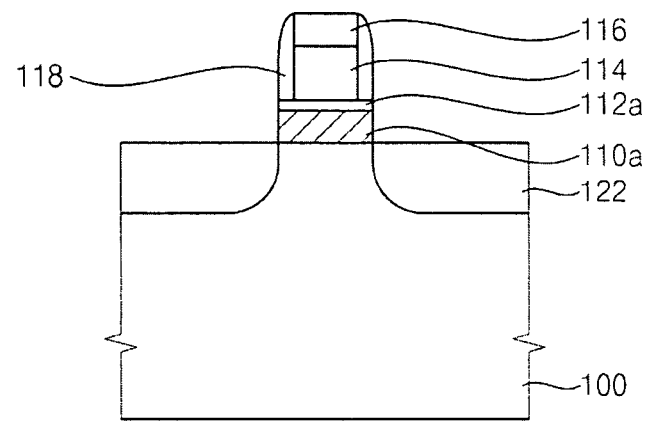

Referring to FIG. 8, a first spacer layer (not shown) may be formed on the gate mask 116, the gate electrode 114 and the gate insulation layer 112. The first spacer layer may be formed using, for example, a nitride having a thickness of less than about 100 Å. An etch back process may be performed on the first spacer layer until a top surface of the gate mask 116 is exposed, forming a first spacer 118 on sidewalls of the gate mask 116 and the gate electrode 114.

The gate insulation layer 112 and the epitaxial layer 110 may be patterned using the gate mask 116, the gate electrode 114 and the first spacer 118 as an etch mask to form a gate insulation layer pattern 112a and an epitaxial layer pattern 110a, respectively. One or more impurities may be implanted into the substrate 100 using the gate mask 116, the gate electrode 114, the first spacer 118, the gate insulation layer pattern 112a and the epitaxial layer pattern 110a as an ion implantation mask to form an impurity region 122 at an upper portion of the substrate 100. The impurities may include, for example, boron, gallium, and/or indium.

Figure 9:
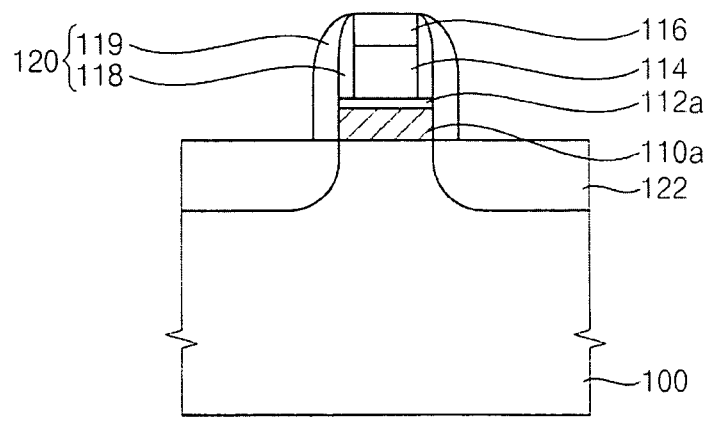

Referring to FIG. 9, a second spacer layer (not shown) may be formed on the gate mask 116, the first spacer 118, the gate insulation layer pattern 112a, the epitaxial layer pattern 110a and the substrate 100. The second spacer layer may be formed using, for example, a nitride having a thickness of less than about 100 Å. An etch back process may be performed on the second spacer layer until the top surface of the gate mask 116 is exposed, forming a second spacer 119 on sidewalls of the first spacer 118, the gate insulation layer pattern 112a and the epitaxial layer pattern 110a. The first and second spacers 118 and 119 may be called a gate spacer 120.

One or more impurities may be implanted into the substrate 100 using the gate mask 116, the gate electrode 114, the gate spacer 120, the gate insulation layer pattern 112a and the epitaxial layer pattern 110a as an ion implantation mask to form an impurity region (not shown) at an upper portion of the substrate 100. The impurities may include, for example, boron, gallium and/or indium. The impurity region 122 together with the impurity region that is not shown may define a source/drain region having a lightly doped drain (LDD) structure.

Figure 10:
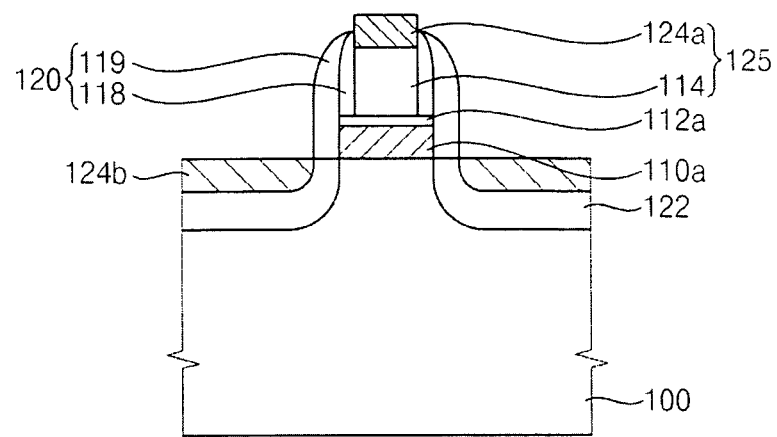

Referring to FIG. 10, the gate mask 116 may be removed to expose a top surface of the gate electrode 114. A metal layer (not shown) may be formed on the substrate 100 and the exposed top surface of the gate electrode 114. The metal layer (e.g., cobalt) may be formed, for example, to have a thickness of less than about 500 Å. A rapid thermal process (RTP) may be performed on the substrate 100, for example, at a temperature of about 550 to about 950° C., so that top surfaces of the gate electrode 114 and the substrate 100 may be silicidated to form a first metal silicide layer 124a and a second metal silicide layer 124b, respectively. According to example embodiments of the inventive concepts, the RTP may be performed twice at different conditions.

A remaining portion of the metal layer that is not reacted with silicon of the gate electrode 114 and/or the substrate 100 may be removed. A semiconductor device of FIG. 1 may be manufactured.

Figure 11:
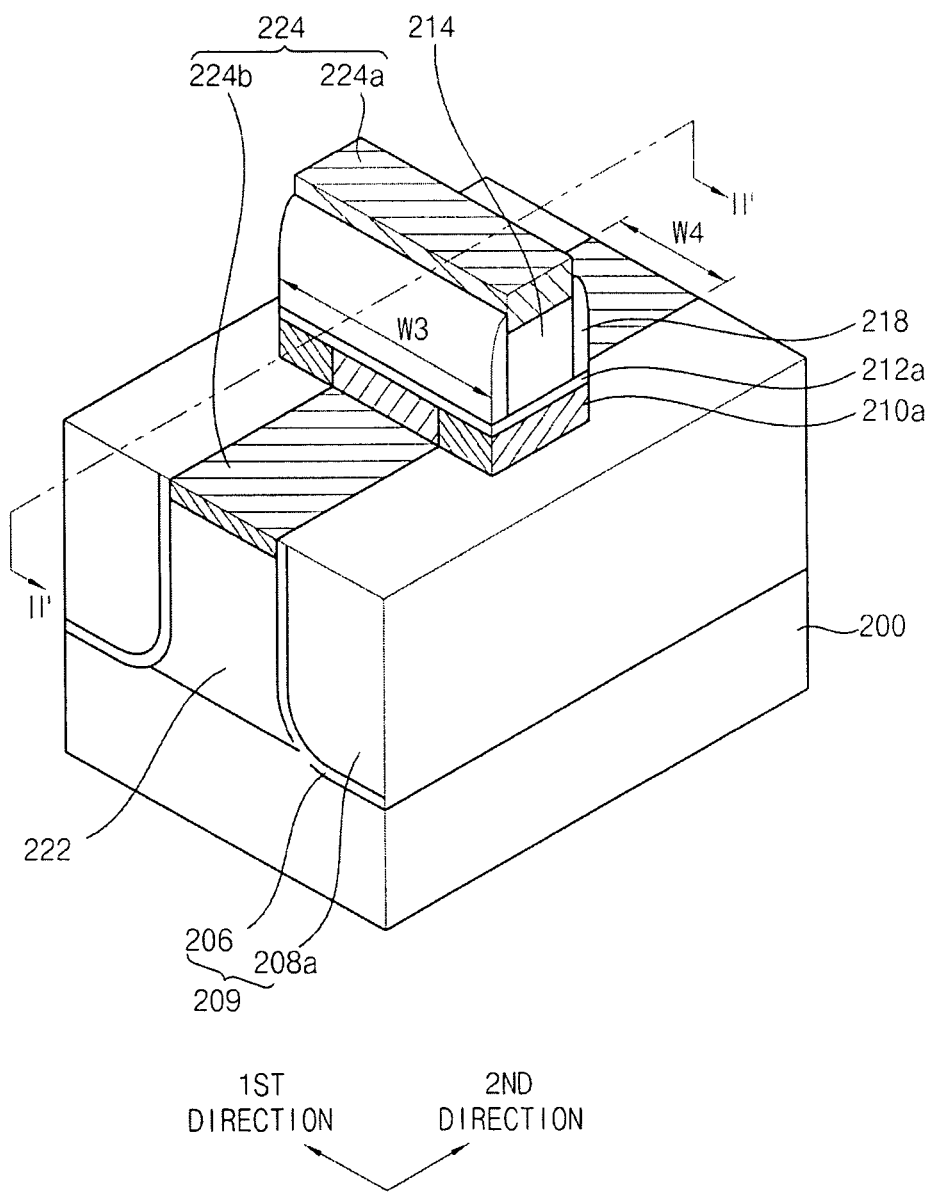

FIG. 11 is a perspective view illustrating a semiconductor device according to example embodiments of the inventive concepts. The semiconductor device of FIG. 10 may be substantially the same as that of FIG. 1, except for an epitaxial layer pattern 210a, a gate insulation layer pattern 212a, a gate spacer 218 and a second metal silicide layer 224b. Referring to FIG. 11, a semiconductor device may include an epitaxial layer pattern 210a, a gate insulation layer pattern 212a, a gate electrode 214, metal silicide layers 224, a gate spacer 218 and a source/drain region 222.

The epitaxial layer pattern 210a may be on a substrate 200 and an isolation layer pattern 209. The isolation layer pattern 209 may be on the substrate 200 to define an active region in the substrate 200. The isolation layer pattern 209 and the active region of the substrate 200 may extend in a second direction 2ND DIRECTION. The active region may have a width W4 in a first direction 1ST DIRECTION perpendicular to the second direction 2ND DIRECTION. The isolation layer pattern 209 may include a gap filling layer pattern 208a and a liner 206. The liner 206 may be between the substrate 200 and the gap filling layer pattern 208a.

According to example embodiments of the inventive concepts, the epitaxial layer pattern 210a may have a width W3 in the first direction 1ST DIRECTION. The epitaxial layer pattern 210a may serve as a channel of the semiconductor device. The gate insulation layer pattern 212a may be on the epitaxial layer pattern 210a and the second metal silicide layer 224b. The gate insulation layer pattern 212a may be on the epitaxial layer pattern 210a, the second metal silicide layer 224b and the isolation layer pattern 209. The gate insulation layer pattern 212a may extend in the first direction 1ST DIRECTION. The gate electrode 214 may be on the gate insulation layer pattern 212a.

The metal silicide layers 224 may include a first metal silicide layer 224a and the second metal silicide layer 224b. The first metal silicide layer 224a may be on the gate electrode 214. The second metal silicide layer 224b may be at an upper portion of the substrate 200 adjacent to the gate spacer 218 and a lateral portion of the epitaxial layer pattern 210a. The second metal silicide layer 224b may have a top surface at a level that is lower than a top surface of the epitaxial layer pattern 210a.

The gate spacer 218 may be on sidewalls of the gate electrode 214 and the first metal silicide layer 224a. The source/drain region 222 may be at an upper portion of the substrate 200 beneath the second metal silicide layer 224b adjacent to the epitaxial layer pattern 210a. The source/drain region 222 may have a top surface at a level that is lower than a top surface of the epitaxial layer pattern 210a. A semiconductor device may include the epitaxial layer pattern 210a having a width W3 that is greater than the width W4 of the active region. An inverse narrow width effect may be prevented and/or reduced.

Figure 12:
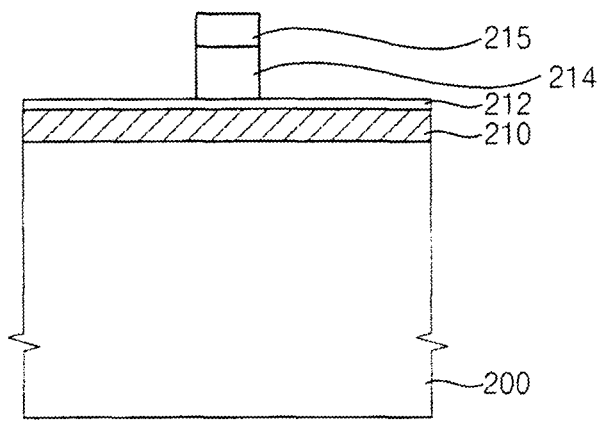
Figure 12:
Figure 13:
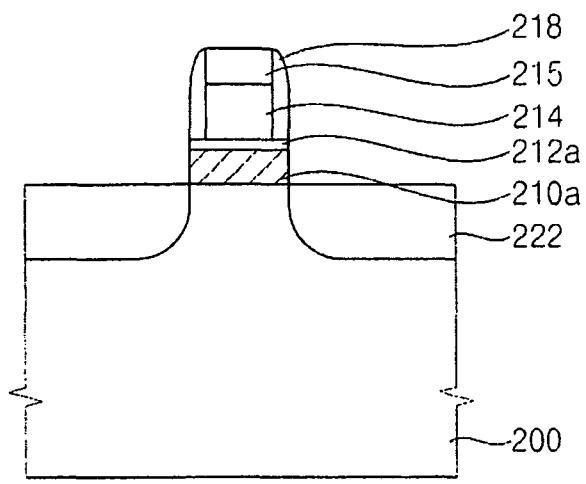
Figure 14:
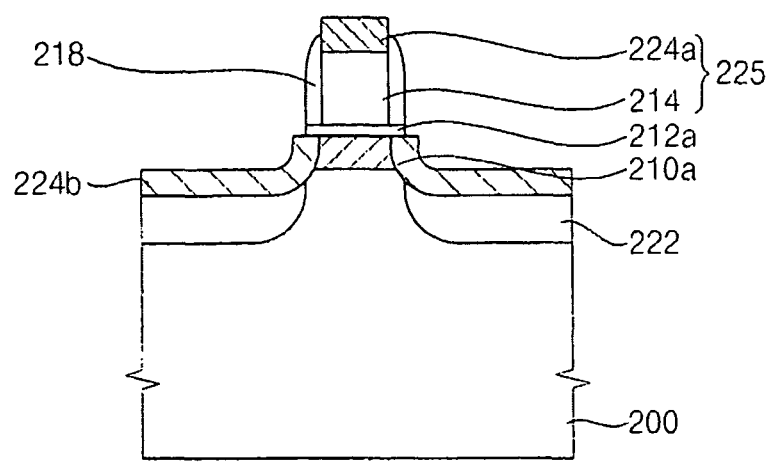

FIGS. 12-14 are cross-sectional views illustrating methods of manufacturing the semiconductor devices of FIG. 11 in accordance with example embodiments of the inventive concepts. FIGS. 12-14 are cross-sectional views taken along the line II-II' of FIG. 11. Processes substantially the same as those of FIGS. 2-6 may be performed to form a liner 206, an isolation layer pattern 209 (see FIG. 11) and an epitaxial layer 210 on a substrate 200. The isolation layer pattern 209 may include a gap filling layer pattern 208a and a liner 206.

Referring to FIGS. 11 and 12, a gate insulation layer 212 may be formed on the epitaxial layer 210 and the isolation layer pattern 209. The gate insulation layer 212 may be formed using, for example, silicon oxide, silicon oxynitride and/or a high-k oxide. According to example embodiments of the inventive concepts, the gate insulation layer 212 may be formed by a thermal oxidization process. The gate insulation layer 212 may be selectively formed on the epitaxial layer 210.

A conductive layer (not shown) may be formed on the gate insulation layer 212. The conductive layer may be formed using, for example, doped polysilicon. According to example embodiments of the inventive concepts, the conductive layer may be formed to have a thickness of, for example, less than about 2,500 Å. The conductive layer may be formed to have a multi-layered structure including, for example, doped polysilicon, a metal and/or a metal silicide. A gate mask layer (not shown) may be formed on the conductive layer. The gate mask layer may be formed using, for example, silicon nitride and/or silicon oxide. The gate mask layer may be patterned using a photoresist pattern (not shown) to form a gate mask 215 extending in a first direction 1ST DIRECTION. The photoresist pattern may be removed. The conductive layer may be patterned using the gate mask 216 as an etch mask to form a gate electrode 214.

Referring to FIG. 13, a gate spacer layer (not shown) may be formed on the gate mask 215, the gate electrode 214 and the gate insulation layer 212. The gate spacer layer may be formed using, for example, a nitride having a thickness of less than about 100 Å. An etch back process may be performed on the gate spacer layer until a top surface of the gate mask 215 is exposed, forming a gate spacer 218 on sidewalls of the gate mask 215 and the gate electrode 214. The gate insulation layer 212 and the epitaxial layer 210 may be patterned using the gate mask 215, the gate electrode 214 and the gate spacer 218 as an etch mask to form a gate insulation layer pattern 212a and an epitaxial layer pattern 210a, respectively.

One or more impurities may be implanted into the substrate 200 using the gate mask 215, the gate electrode 214, the gate spacer 218, the gate insulation layer pattern 212a and the epitaxial layer pattern 210a as an ion implantation mask to form a source/drain region 222 at an upper portion of the substrate 200. The impurities may include, for example, boron, gallium and/or indium. The source/drain region 222 may be formed to have an LDD structure.

Referring to FIG. 14, the gate mask 215 may be removed to expose a top surface of the gate electrode 214. A metal layer (not shown) may be formed on the substrate 200, the exposed top surface of the gate electrode 214 and a portion of the epitaxial layer pattern 210a. The metal layer may be formed to have a thickness of, for example, less than about 500 Å. The metal layer may be, for example, cobalt. An RTP may be performed on the substrate 200 at a temperature of, for example, about 550 to about 950° C. Top surfaces of the gate electrode 214 and the substrate 200 and the portion of the epitaxial layer pattern 210a may be silicidated to form a first metal silicide layer 224a and a second metal silicide layer 224b. The first metal silicide layer 224a may be formed on the gate electrode 214, and the second metal silicide layer 224b may be formed on the substrate 200 and the portion of the epitaxial layer pattern 210a. According to example embodiments of the inventive concepts, the RTP may be performed twice at different conditions.

A remaining portion of the metal layer that is not reacted with silicon of the gate electrode 214, the portion of the epitaxial layer pattern 210a and/or the substrate 200 may be removed. The semiconductor device of FIG. 11 may be manufactured.

Figure 15:
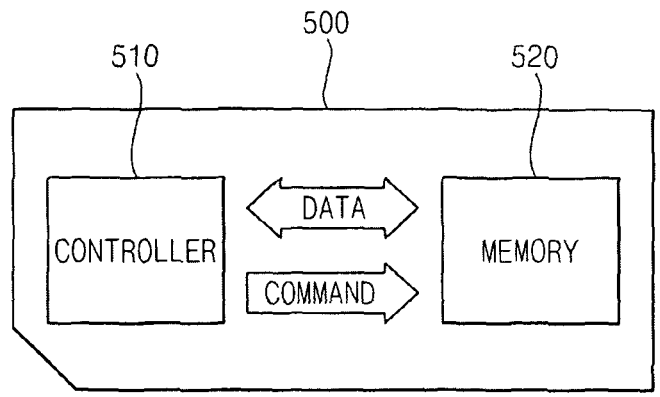

FIG. 15 is a schematic diagram illustrating a memory card 500 according to example embodiments of the inventive concepts. Referring to FIG. 15, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1-14. A memory card 500 may be used as a storage medium for various portable electronic devices. For example, the memory card 500 may be a multimedia card (MMC) or a secure digital (SD) card.

Figure 16:
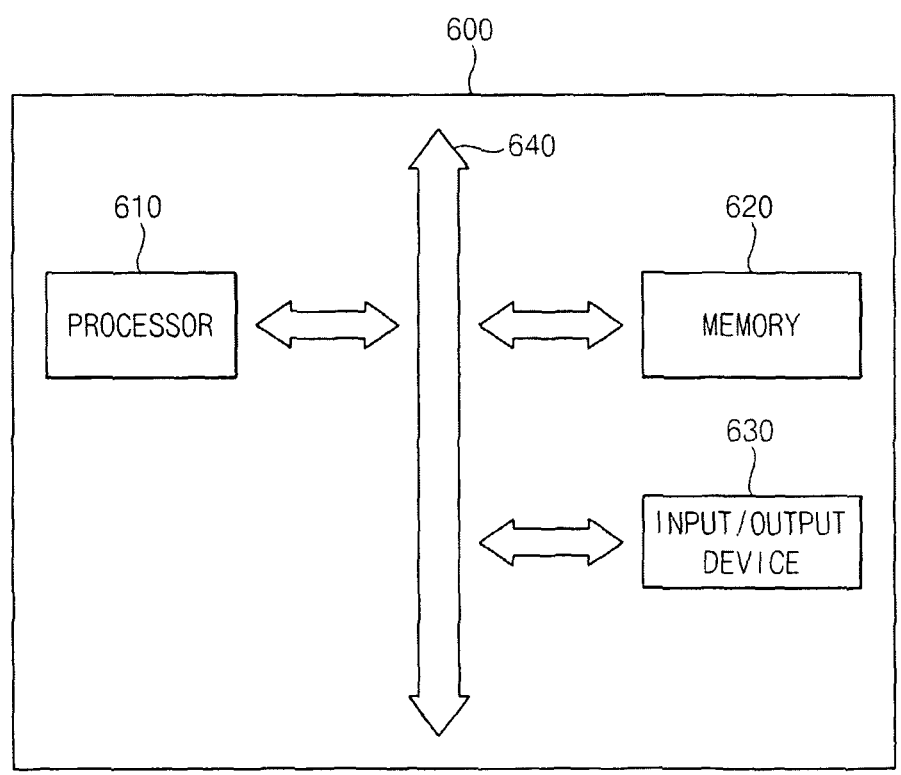

FIG. 16 is a block diagram roughly illustrating an electronic system 600 according to example embodiments. Referring to FIG. 16, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device (e.g. a personal computer or a network) by using the input/output device 630 and may exchange data with the external device.

The memory 620 may store codes or programs for operations of the processor 610. For example, the memory 620 may include one of the non-volatile memory devices described above in reference to FIGS. 1-14. For example, an electronic system 600 may embody various electronic control systems requiring the memory 620, and, for example, may be used in mobile phones, MP3 players, navigation devices, solid state disks (SSD), or household appliances.

According to example embodiments of the inventive concepts, a semiconductor device may include an epitaxial layer pattern serving as a channel, the epitaxial layer pattern having a single crystalline material and a width larger than that of an active region of a substrate. The semiconductor device may have improved threshold voltage characteristics and/or improved reliability.

While example embodiments have been particularly shown and described, it will be understood by one of ordinary skill in the art that variations in form and detail may be made therein without departing from the spirit and scope of the claims.

What is claimed is:

1. A semiconductor device, comprising:
a substrate;
an isolation layer on the substrate, the isolation layer extending in a first direction parallel to an upper surface of the substrate;
an active region in the substrate, the isolation layer defining the active region;
an epitaxial layer on the active region and the isolation layer, the active region wider than the epitaxial layer in the first direction and the epitaxial layer wider than the active region in a second direction perpendicular to the first direction and parallel to the upper surface of the substrate;
a gate insulation layer on the epitaxial layer; and
a gate electrode on the gate insulation layer;
source and drain regions at upper portions of the active region adjacent to the epitaxial layer, the source and drain regions being spaced apart from each other in the first direction.

2. The semiconductor device of claim 1, wherein the isolation layer is in a trench in the substrate, and
wherein the isolation layer includes a gap fill layer and a liner, the gap fill layer being located in the trench and the liner being located between the gap fill layer and the substrate.

3. The semiconductor device of claim 1, wherein the epitaxial layer includes a single crystalline material.

4. The semiconductor device of claim 1, further comprising:
a first spacer on a sidewall of the gate electrode.

5. The semiconductor device of claim 4, further comprising:
a second spacer on a sidewall of the first spacer, the gate insulation layer and the epitaxial layer.

6. The semiconductor device of claim 4, wherein the first spacer is on the gate insulation layer.

7. The semiconductor device of claim 1, further comprising:
a source/drain region in the active region, the source/drain region adjacent to the epitaxial layer pattern, a top surface of the source/drain region below a top surface of the epitaxial layer.

8. The semiconductor device of claim 1, further comprising:
a first silicide layer on the gate electrode; and
a second silicide layer on the active region adjacent to the epitaxial layer.

9. A memory card comprising the semiconductor device of claim 1.

10. The semiconductor device of claim 1, wherein the source/drain regions are under a bottom surface of the epitaxial layer.

11. The semiconductor device of claim 1, wherein top surfaces of the source/drain regions and the isolation layer, and a bottom surface of the epitaxial layer are substantially coplanar.

12. A semiconductor device, comprising:
a substrate;
a plurality of shallow trench isolation (STI) regions in the substrate, each of the STI regions extending in a first direction parallel to an upper surface of the substrate;
an active region in the substrate between the plurality of STI regions;
an epitaxial layer on the plurality of STI regions and the active region, the active region wider than the epitaxial layer in the first direction and the epitaxial layer wider than the active region in a second direction perpendicular to the first direction and parallel to the upper surface of the substrate;
a gate stack on the epitaxial layer; and
source/drain regions at upper portions of the active region adjacent to the epitaxial layer, the source and drain regions being spaced apart from each other in the first direction.

13. The semiconductor device of claim 12, wherein the source/drain regions include
a first source/drain region in the active region,
a second source/drain region in the active region, the epitaxial layer between the first and second source/drain regions, and
a first silicide layer on the first and second source/drain regions,
wherein the gate stack includes a first spacer, a gate insulation layer, a gate electrode and a second silicide layer.

14. The semiconductor device of claim 13, further comprising:
a second spacer on a sidewall of the epitaxial layer, the gate insulation layer, and the first spacer.

15. The semiconductor device of claim 14, wherein the first and second source/drain regions include lightly doped regions having a width about a width of the second spacer.

16. The semiconductor device of claim 13, wherein the first silicide layer is on a sidewall of the epitaxial layer.

17. An electronic system comprising the semiconductor device of claim 12.

* * * * *